(12) United States Patent
Hartel

(10) Patent No.: US 6,702,125 B2
(45) Date of Patent: Mar. 9, 2004

(54) SUPPORT FRAME HAVING ADJUSTABLE VERTICAL SUPPORTS

(75) Inventor: Marc Hartel, Reiskirchen (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/094,514

(22) Filed: Mar. 8, 2002

(65) Prior Publication Data
US 2002/0162809 A1 Nov. 7, 2002

(30) Foreign Application Priority Data
Mar. 9, 2001 (DE) .......................... 101 11 314

(51) Int. Cl.⁷ ............................................. A47F 5/00
(52) U.S. Cl. ..................... 211/26; 211/175; 211/189; 312/265.1; 312/265.4; 361/829; 361/683
(58) Field of Search .................... 211/26, 175, 189; 361/683, 829; 312/223.1, 223.2, 265.1, 264, 265.4

(56) References Cited

U.S. PATENT DOCUMENTS

| 5,433,327 A | * | 7/1995 | Benvenuti et al. ........... 211/193 |
| 5,683,001 A | * | 11/1997 | Masuda et al. ................ 211/26 |
| 5,975,315 A | * | 11/1999 | Jordan .......................... 211/26 |
| 6,047,838 A | * | 4/2000 | Rindoks et al. .............. 211/187 |
| 6,238,029 B1 | * | 5/2001 | Marzec et al. ............ 312/265.3 |
| 6,240,687 B1 | * | 6/2001 | Chong .......................... 52/238.1 |
| 6,279,756 B1 | * | 8/2001 | Walter et al. .................. 211/26 |
| 6,321,917 B1 | * | 11/2001 | Mendoza ....................... 211/26 |
| 6,338,413 B1 | * | 1/2002 | Walter et al. .................. 211/26 |
| 6,349,837 B1 | * | 2/2002 | Serban .......................... 211/26 |
| 6,481,582 B1 | * | 11/2002 | Rinderer ....................... 211/26 |
| 6,489,565 B1 | * | 12/2002 | Krietzman et al. .......... 174/101 |
| 6,502,702 B1 | * | 1/2003 | Hsue et al. .................... 211/26 |
| 2002/0026753 A1 | * | 3/2002 | Ray ................................. 52/27 |
| 2002/0117462 A1 | * | 8/2002 | Hung .......................... 211/189 |
| 2002/0179548 A1 | * | 12/2002 | Rinderer ....................... 211/26 |

FOREIGN PATENT DOCUMENTS

DE    92 04 134.5    6/1992

* cited by examiner

Primary Examiner—Daniel P. Stodola
Assistant Examiner—Jennifer E. Novosad
(74) Attorney, Agent, or Firm—Pauley Petersen & Erickson

(57) ABSTRACT

A support frame for receiving external electrical devices, having a base frame on which two vertical supports are fastened, which are arranged parallel at a distance from each other and each of which has a first profiled leg. The first profiled legs face each other, project into the installation space formed by the supports and have at least one row of attachment receivers cut in a division pattern. In order to retrofit such a support frame for different fastening size systems, each one of the supports has at least one second profiled leg, which has a row of attachment receivers cut in the division pattern and which projects from the support facing away from the installation space. The division pattern of the first profiled leg is different from that of the second profiled leg. The supports are fastened on the base frame in two installation positions, which are rotated by 180° around the longitudinal axes of the supports.

14 Claims, 3 Drawing Sheets

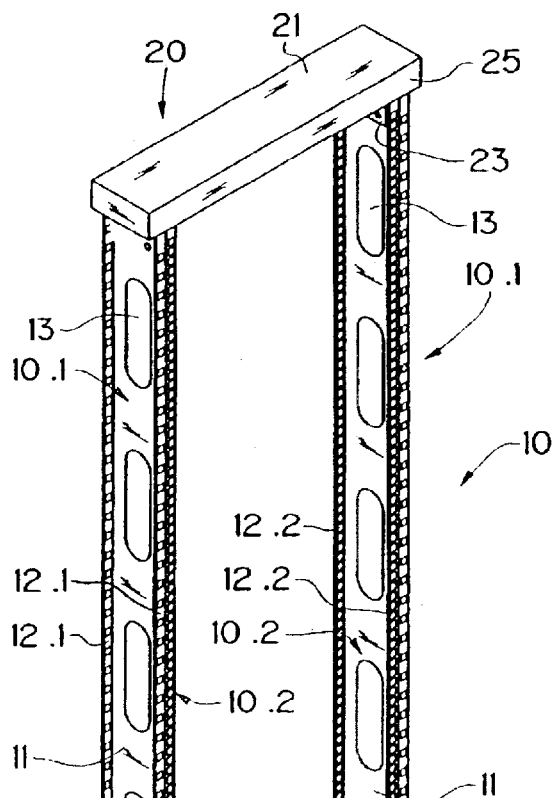
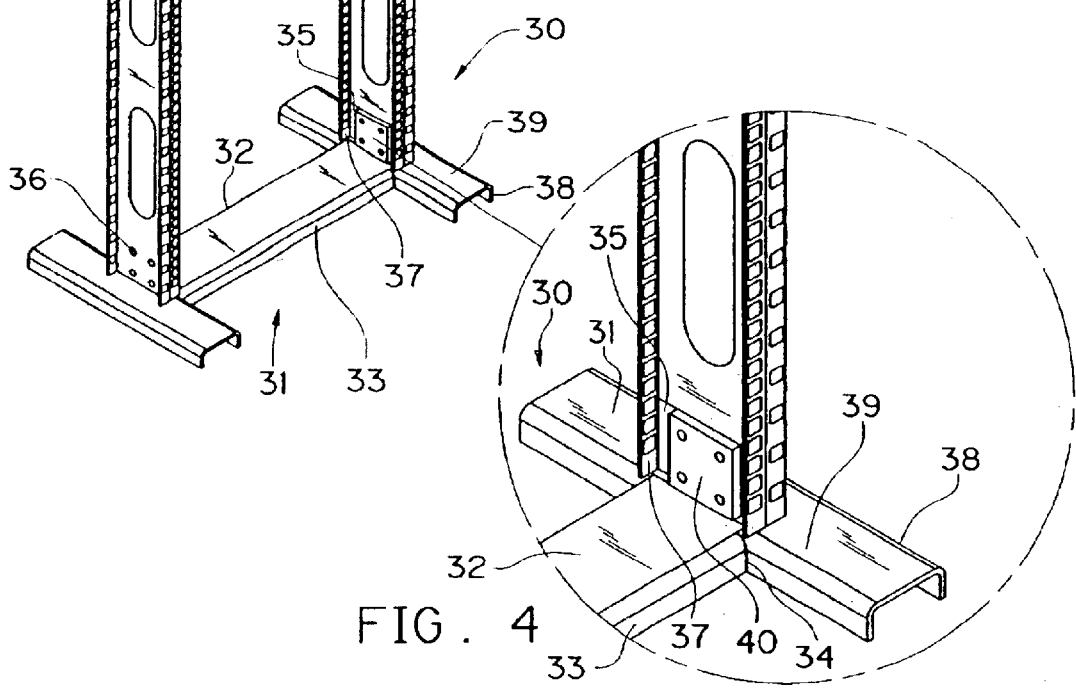
FIG. 3
FIG. 4

SUPPORT FRAME HAVING ADJUSTABLE VERTICAL SUPPORTS

BACKGROUND OF THE INVENTION

1. Field of the Invention

This invention relates to a support frame for receiving external electrical devices, having a base frame on which two vertical supports are fastened, which are arranged parallel at a distance from each other and each of which has a first profiled leg, wherein the first profiled legs face each other, project into the installation space formed by the supports and have at least one row of attachment receivers cut in the division pattern.

2. Description of Related Art

A support frame is known from German Patent Reference DE 92 04 134 U1, which teaches two vertical and two horizontal supports and the frame is fastened on a base frame. The vertical supports are U-shaped in cross section and have two profiled legs, which extend parallel with each other, and a connecting section. The profiled legs have rows of attachment receivers and protrude into the installation space enclosed by the frame. Electrical built-in units can be fastened on the profiled legs. The attachment dimensions of the built-in units are mostly designed for a standardized attachment system. The most common system of units here are the metric attachment system or the English.

SUMMARY OF THE INVENTION

It is one object of this invention to provide a support frame as mentioned above but which can be easily retrofitted in a simple manner to various systems of units for attachment.

This object is achieved by each support having at least one second profiled leg, which has a row of attachment receivers cut in the division pattern and which projects from the support facing away from the installation space. The division pattern of the first profiled leg is different from that of the second profiled leg. The supports are fastened on the base frame in two installation positions, which are rotated by 180° around the longitudinal axes of the supports.

Each of the supports has at least two profiled legs. These have two rows of attachment receivers, wherein the attachment receivers on the two profiled legs are distanced from each other by different division patterns. For example, it is possible to realize a metric division pattern on the first profiled leg, and one on the inch on the second.

Depending on the measuring system of the external devices selected, the supports are mounted so that the respectively associated profiled legs protrude into the installation space.

With different attachment measuring systems it is often required that the horizontal distance between the attachment receivers of the oppositely located profiled legs be varied. Thus, according to a preferred embodiment of this invention, the base frame has attachment shoulders on which the supports can be attached, and the attachment shoulders form two attachment surfaces, which are spaced apart parallel with each other in the horizontal direction, on which the supports are fastened in the respective installation positions.

To be able to mount the support rapidly and easily, and to achieve at the same time a connection with the base frame, in accordance with this invention, the base frame has two footed supports which are connected with each other via a transverse strut. On its ends on the long side facing the footed supports the transverse strut has angled pieces, which form the attachment shoulders. The transverse strut forms a support flange in the areas of the attachment shoulders, which rests on the footed supports and is connected with it by screws.

The stability of the support connection is improved if the attachment shoulders are bent off in one piece from the transverse strut, so that a spacer, which is connected with attachment shoulder and the transverse strut, is inserted into an area enclosed by the attachment section and the transverse strut. The spacer and the side of the attachment shoulder facing away from the spacer each provide an attachment surface for installing the support in different installation positions. In a further function, the spacer makes it possible for the supports to be arranged at different distances from each other.

In one embodiment of this invention, the supports are formed in a double-T shape in cross section, from four profiled legs and a connecting section. This makes possible both a front mounting as well as a rear mounting of external devices on the supports. It is also possible for the supports to be assembled from two partial profiled sections of U-shaped cross section, wherein the parallel legs of the U shape form the profiled legs. The two partial profiled sections then can have an identical cross section. This results in a double-T structure.

In order to be able to provide better wiring of the external electrical devices, according to this invention, the connecting section of the support has one or several cable ducts.

In one embodiment of this invention, on their ends facing away from the base frame the supports are connected with attachment shoulders of a transverse support. The attachment shoulders protrude away in a direction toward the base frame and provide two attachment surfaces for two installation positions of the supports.

BRIEF DESCRIPTION OF THE DRAWINGS

This invention is explained in greater detail in view of an embodiment shown in the drawings, wherein:

FIG. 3 shows a support frame in accordance with FIG. 1, but in an unassembled state;

FIG. 4 shows an enlarged detail view of FIG. 3; and

DESCRIPTION OF PREFERRED EMBODIMENTS

Figures 1, 2:
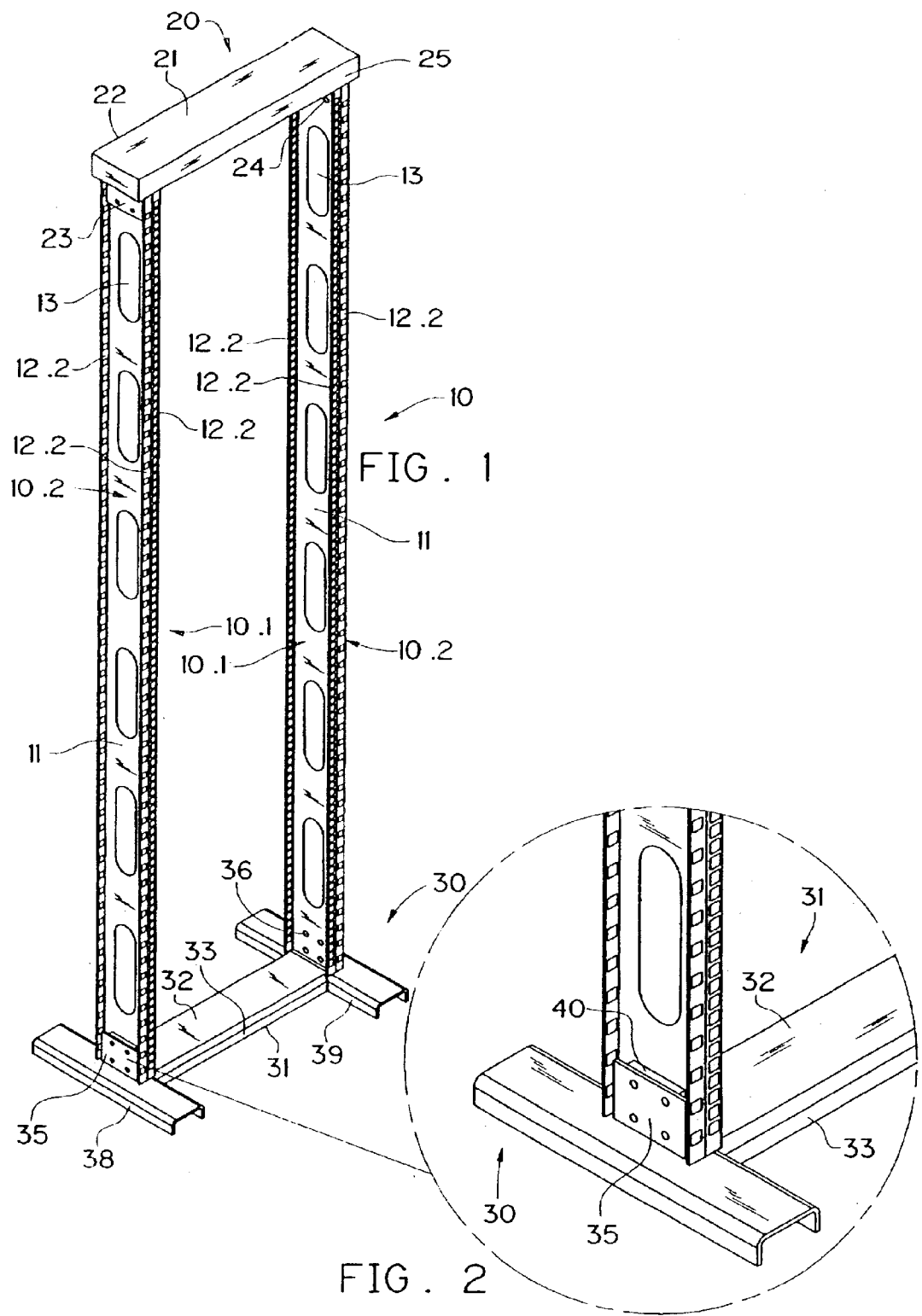
FIG. 1 shows a support frame in a perspective view.
FIG. 2 shows an enlarged detail view of FIG. 1.
Figure 5:
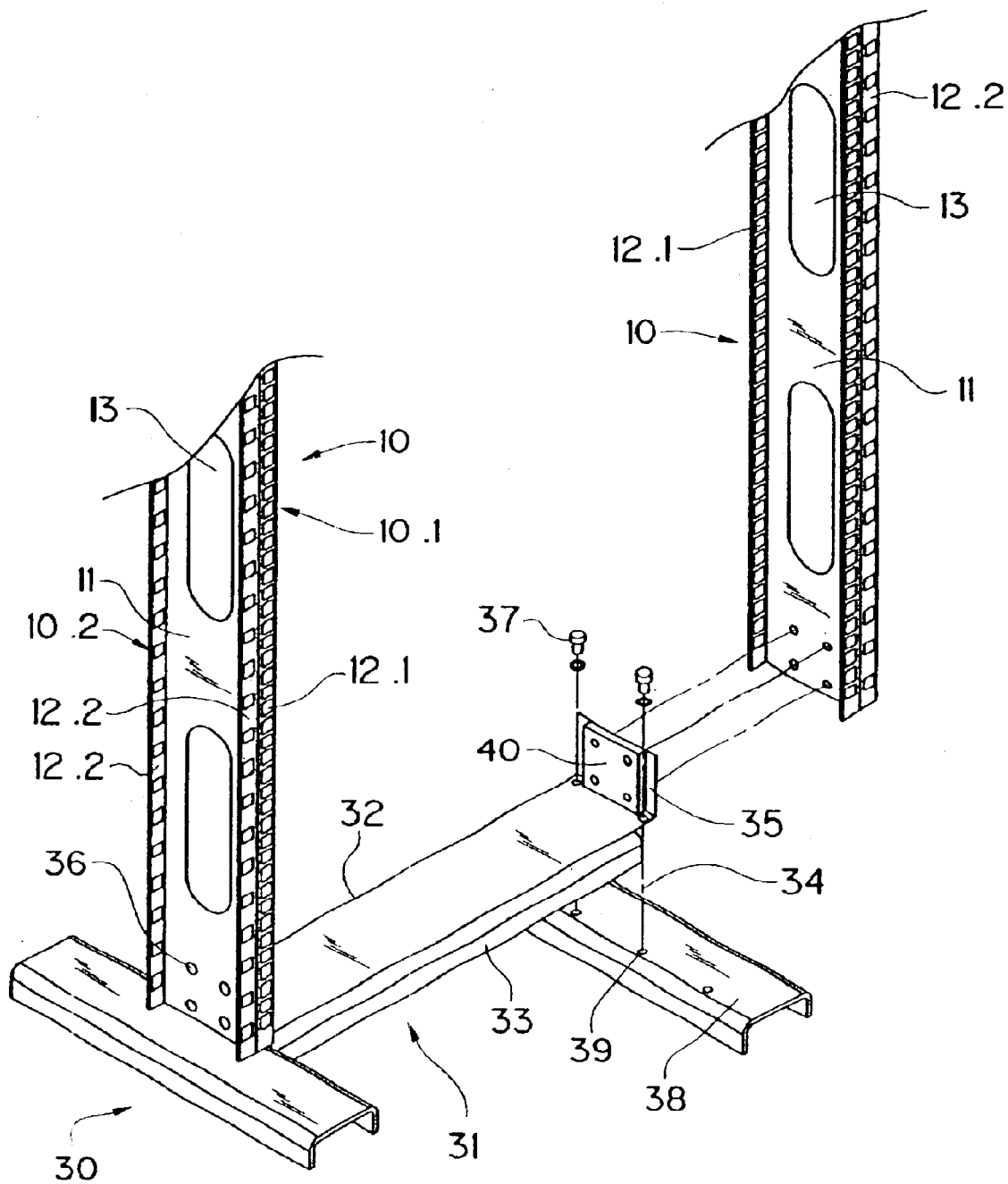
FIG. 5 shows a support frame in accordance with FIG. 3, in a partial plan view and in an exploded view.

A support frame with two vertical supports 10 which are mounted on a base frame 30 are represented in FIG. 1. The base frame 30 is assembled from two horizontal footed supports 38 extending in a direction of a depth of the frame, and of a transverse strut 31 extending in a direction of a width. The footed supports 38 are embodied as U-shaped profiles, with open sides turned toward the bottom. Attachment receivers 39 are cut in an upward oriented connecting section of the footed support 38. The transverse strut is also U-shaped. It has a horizontal base 32, from the front and back of which beveled pieces 33 are angled off. FIG. 5 shows that the beveled pieces 33 do not extend over the total length of the base 32, so that receivers 34 are kept free. A flange resting on the footed supports 38 is formed above the receivers 34. The footed supports 38 contact ends on the long side of the bevels 33 and can be accurately aligned with the transverse strut 31 and parallel with each other. The transverse strut 31 can be screwed to the footed supports 38 with screws 37. As shown in FIG. 5, the transverse strut 31 has two attachment shoulders 35 bent off the ends on the long side of the transverse strut 31. A spacer 40 is inserted into the corner area enclosed by the base 32 and the attachment shoulder 35. It is connected, for example welded, with the base 32, as well as with the attachment shoulder 35.

The two spacers 40 form inwardly oriented attachment surfaces, the two attachment shoulders 35 outwardly oriented attachment surfaces, on which the support 10 can be installed.

The supports 10 are assembled from two U-shaped partial profiled sections 10.1, 10.2. The partial profiled sections 10.1, 10.2 can have identical cross sections, and have a connecting section 11, from which two profiled legs 12.1, or 12.2, which are parallel in relation to each other, are bent. Each of the profiled legs 12.1, 12.2 has a row of attachment receivers. The attachment receivers are spaced apart from each other in identical division patterns. In this case the division pattern of the first profiled leg 12.1 is selected on a Metric scale and the second profiled leg 12.1 on an English scale.

At their connecting sections 11, the supports 10 have several cable ducts 13 that provide a connection between the exterior of the supports 10 and the installation space surrounded by the supports 10.

As FIGS. 1 and 2 show, the supports 10 can be installed in two positions on the attachment shoulders 35. They can either be screwed directly to the exteriors of the attachment shoulders 35, or to the interiors of the spacers 40, or screws 36. The distance between the supports 10, and thus the size of the installation width for the external electrical devices, can thereby be changed. At the same time the supports 10 can also be rotated by 180° around their longitudinal axis, so that either the first profiled legs 12.1 or the second profiled legs 12.1 face inward and project into the installation space. Thus the installation pattern can be easily varied between the Metric installation size and the English installation size.

For improving the stability of the support frame, the two supports 10 are connected, facing away from the base frame 30, by a transverse support 20. The transverse support 20 has a cover section 21, from which an edge 25 is bent off around a circumference. Attachment receivers 23 are cut into the cover section. A cable duct can thereby be fastened and can also be used for attachment to a ceiling or a line-up of several support frames.

Attachment shoulders 23 protrude from an underside of the transverse support 20. These are equipped with spacers 40 and make possible a variable support installation.

What is claimed is:

1. In a support frame for receiving external electrical devices, having a base frame on which two vertical supports are fastened and are arranged parallel at a distance from each other, each of the vertical supports having a first profiled leg, wherein the first profiled legs face each other and project into an installation space formed by the supports and have at least one row of attachment receivers spaced apart from each other in a first scaled pattern, the improvement comprising:

each of the vertical supports (10) having at least one second profiled leg (12.2) which has a row of attachment receivers spaced apart from each other in a second scaled pattern and which projects in a direction away from the installation space, the first scaled pattern of the first profiled leg (12.1) being different from the second scaled pattern of the second profiled leg (12.2), and the vertical supports (10) being fastened on the base frame (30) in one of a first installation position and a second installation position rotated by 180° around longitudinal axes of the vertical supports (10) with respect to the first installation position.

2. In the support frame in accordance with claim 1, wherein the base frame (30) has attachment shoulders (35) on which the vertical supports (10) are attached, and the attachment shoulders (35) forming two attachment surfaces spaced apart and parallel with each other in a horizontal direction, on which the vertical supports (10) are fastened in the first installation position.

3. In the support frame in accordance with claim 2, wherein the base frame (30) has two footed supports (38) connected with each other via a transverse strut (31), the transverse strut (31) has angled pieces which form the attachment shoulders (35) at a first end portion and a second end portion, and the transverse strut (31) forms a support flange which rests on the footed supports (38).

4. In the support frame in accordance with claim 3, wherein the attachment shoulders (35) are bent from the transverse strut (31), a spacer (40) is connected with each attachment shoulder (35) and with the transverse strut (31) and positioned within an area enclosed by the attachment shoulder (35) and the transverse strut (31), the spacers form an attachment surface for installing vertical supports (10) in the second installation position.

5. In the support frame in accordance with claim 4, wherein the vertical supports (10) are formed in a double-T shape in cross section from four profiled legs (12.1, 12.2) and a connecting section.

6. In the support frame in accordance with claim 5, wherein the vertical supports (10) are assembled from two partial profiled sections (10.1, 10.2) each of a U-shaped cross section, and the parallel legs of a U-shape form the profiled legs. least one cable duct (13).

7. In the support frame in accordance with claim 6, wherein the connecting section (11) of the supports (10) has at least one cable duct (13).

8. In the support frame in accordance with claim 5, wherein the connecting section (11) of the supports (10) has at least one cable duct (13).

9. In the support frame in accordance with claim 8, wherein on ends facing away from the base frame (30) the vertical supports (10) are connected with attachment shoulders (23) of a transverse support (20), and the attachment shoulders (23) protrude away toward the base frame (30) and provide two attachment surfaces for two installation positions of the vertical supports (10).

10. In the support frame in accordance with claim 2, wherein the attachment shoulders (35) are bent from the transverse strut (31), a spacer (40) is connected with each attachment shoulder (35) and with the transverse strut (31) and positioned within an area enclosed by the attachment shoulder (35) and the transverse strut (31), the spacers form an attachment surface for installing vertical supports (10) in the second installation position.

11. In the support frame in accordance with claim 1, wherein the base frame (30) has two footed supports (38) connected with each other via a transverse strut (31), the transverse strut (31) has angled pieces which form attachment shoulders (35) at a first end portion and a second end portion, and the transverse strut (31) forms a support flange which rests on the footed supports (38).

12. In the support frame in accordance with claim 1, wherein the vertical supports (10) are formed in a double-T shape in cross section from four profiled legs (12.1, 12.2) and a connecting section.

13. In the support frame in accordance with claim 1, wherein the vertical supports (10) are assembled from two partial profiled sections (10.1, 10.2) each of a U-shaped cross section, and the parallel legs of a U-shape form the profiled legs.

14. In the support frame in accordance with claim 1, wherein on ends facing away from the base frame (30) the vertical supports (10) are connected with attachment shoulders (23) of a transverse support (20), and the attachment shoulders (23) protrude away toward the base frame (30) and provide two attachment surfaces for two installation positions of the vertical supports (10).

* * * * *